United States Patent [19]

Van Kessel et al.

[11] Patent Number: 4,480,229

[45] Date of Patent: Oct. 30, 1984

[54] AMPLIFIER ARRANGEMENT WITH PARALLEL-OPERATED AMPLIFIER SECTIONS

[75] Inventors: Theodorus J. Van Kessel, Eindhoven, Netherlands; Nico V. Franssen, deceased, late of Knegsel, Netherlands; by Friedrich J. de Haan, administrator, Estherdal, Netherlands

[73] Assignee: U.S. Philips Corporation, New York, N.Y.

[21] Appl. No.: 450,838

[22] Filed: Dec. 20, 1982

Related U.S. Application Data

[63] Continuation-in-part of Ser. No. 214,942, Dec. 10, 1980, abandoned.

[30] Foreign Application Priority Data

Dec. 19, 1979 [NL] Netherlands ............... 7909126

[51] Int. Cl.$^3$ .............................. H03F 3/68
[52] U.S. Cl. ......................... 330/84; 330/85; 330/295
[58] Field of Search ............ 330/84, 85, 150, 152, 330/295

[56] References Cited

U.S. PATENT DOCUMENTS 4,321,552  3/1982  Franssen et al. ............... 330/84

Primary Examiner—James B. Mullins
Assistant Examiner—G. Wan
Attorney, Agent, or Firm—Thomas A. Briody; William J. Streeter; Joseph P. Abate

[57] ABSTRACT

By adding the difference between output and input of the one amplifier section to the output signal by means of a subsequent amplifier section a ring of amplifier sections can be formed which compensate for each other's distortion.

2 Claims, 2 Drawing Figures

AMPLIFIER ARRANGEMENT WITH PARALLEL-OPERATED AMPLIFIER SECTIONS

This is a Continuation-in-Part of application Ser. No. 214,942, filed Dec. 10, 1980 now abandoned.

The invention relates to an amplifier arrangement whose signal input is coupled to the inputs of n amplifier sections, whose outputs are connected single-ended to a common output circuit, through which the output signal currents of the amplifier sections are passed in the same phase, while between the output of each amplifier section and the common output circuit there is included a resistor, that each amplifier section comprises a difference element with a first and a second input, and an output for supplying a corresponding compensation signal, the first input of the difference element being coupled to the input of the corresponding amplifier section, and that for each amplifier section the corresponding compensation signal is applied to the input of the amplifier section.

BACKGROUND OF THE INVENTION

An amplifier arrangement of this type is described in British Patent application No. 2 010 039 A which has been laid open for public inspection, see especially FIG. 2 of the said application. The known amplifier arrangement comprises two amplifier sections connected in parallel, so that n=2. In each amplifier section in the known arrangement a voltage signal is measured across the corresponding resistor. This voltage signal, together with the input voltage of this amplifier section, is applied to inputs of the corresponding difference element.

The compensation signal supplied by the difference element of the one amplifier section is applied to the input of the other amplifier section and vice versa. In this way, with the appropriate settings of the relevant parameters in the system an amplifier arrangement with low distortion can be obtained. However, the known arrangement exhibits a distortion which is sometimes still too high.

OBJECT OF THE INVENTION

It is an object of the invention to provide an arrangment which has a very low distortion and also has a reasonably high output power.

SUMMARY OF THE INVENTION

The arrangement according to the invention is characterized in that, for each amplifier section a negative feedback voltage is derived which depends on the voltage across the output circuit and across the corresponding resistor, that the voltage so derived for the $k^{th}$-amplifier section is applied to the second input of the corresponding difference element and that the corresponding compensation signal of the $k^{th}$-amplifier section is applied to the input of the $(k+1)^{th}$-amplifier section (k ranging from 1 to n, the number n+1 representing the first amplifier section and n being at least 2).

The invention is based on the one hand on the recognitiion that one can obtain an amplifier arrangement in which the amount of distortion suppression is less dependent on the exact settings of the relevant parameters. This could be obtained by deriving for each amplifier section a voltage signal which depends on the voltage across the output circuit and that across the corresponding resistor. In this way negative feedback could be introduced in the arrangement according to the invention, while the known arrangement in which the voltage is derived across the corresponding resistor only is based on the feed-forward principle only, which is generally referred to as the "addition of what is missing" principle known inter alia from the book "Precision Electronics" by Klein and Zaalberg van Zelst, Centrex, Eindhoven 1967, page 164 et seq. On the other hand the extension to more than two amplifier sections connected in parallel to drive the output circuit made it possible to obtain a high output power in the output circuit.

It is to be noted, that German Offenlegungsschrift No. 27 50 974 also describes two or more amplifier sections connected in parallel to drive an output circuit. However, it does not mention the specific measure by means of which a compensation signal is obtained, nor does it mention the specific interconnections between the outputs of the various difference elements of the corresponding amplifier sections and the inputs of successive amplifier section.

Furthermore, it should be noted that the specific interconnections between outputs of the difference elements and inputs of successive amplifier sections in an arrangement according to the invention with two amplifier sections is known from British Patent Application No. 2 010 039 A. However, this publication does not mention the possibility of connecting more than two amplifier sections in parallel, nor does it mention the specific interconnections between the outputs of the various difference elements of the corresponding amplifier sections and the inputs of successive amplifier sections in the case of three or more amplifier sections connected in parallel.

A preferred embodiment of the amplifier arrangement according to the invention, employing amplifier sections with a low internal output impedance, is characterized in that negative voltage feedback is applied between the common output circuit and the input of the amplifier arrangement. In this way the internal resistance of the amplifier arrangement which, in the absence of negative voltage feedback, is increased because of the resistances between the outputs of the amplifier sections and the common output circuit, can be decreased.

BRIEF DESCRIPTION OF THE DRAWINGS

The invention will be described in more detail with reference to the drawing wherein.

DETAILED DESCRIPTION OF THE PREFERRED EMBODIMENTS

Figure 1:
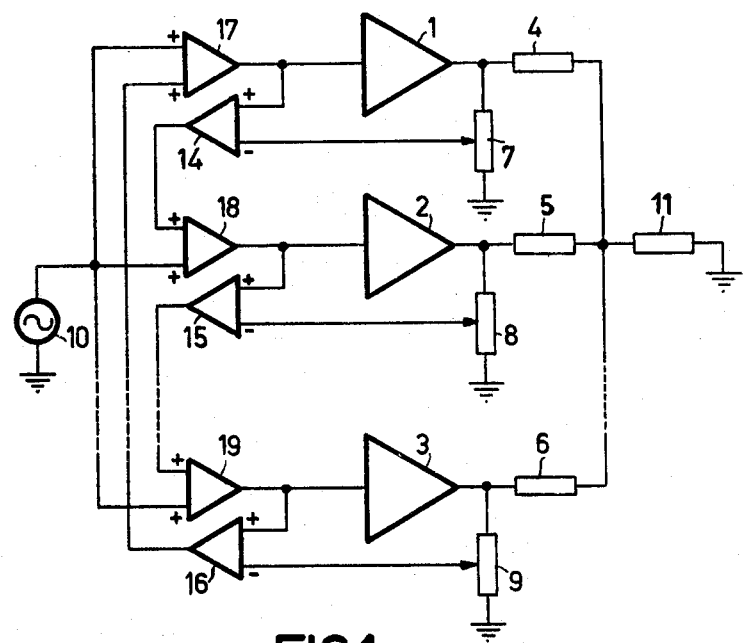
FIG. 1 represents a first embodiment.

In the amplifier arrangement of FIG. 1 the signal from a source 10 is applied to a load 11 to be included or included in a common output circuit via parallel operated amplifier sections 1, 2 and 3. It is to be understood, that, at option, more amplifier sections may be connected in parallel, as indicated by the dashed connecting lines in FIG. 1. These amplifier sections may be constituted by separate operational amplifiers, for example of the emitter-follower type with a low output impedance, but may also be integrated together on one semiconductor body. Between the output of amplifier sections 1, 2, 3 and the common load resistance 11, respective resistors 4, 5 and 6 are included.

The output voltage of the amplifier section 1, after being attenuated in a attenuator 7, is applied to an input of a difference element 14. The input signal of amplifier section 1 as applied to another input of difference element 14. The attenuation factor of the attenuator 7 is adjusted so that the signal amplitudes at the input of the difference element 14 are substantially equal i.e. the attenuation factor is equal to the reciprocal of the gain factor of the amplifier section 1. Thus, this difference element will in principle only form the distortion components (error signals) between the output and the input signal of the amplifier section 1. These error signals are now added to the input signal of the source 10 in a summator 18 and are subsequently applied to the amplifier section 2. If the gain factors of the amplifier sections 1 and 2 are assumed to be equal, this will provide full compensation for the distortion components supplied to the load impedance 11 by the amplifier section 1. Similarly, the output voltage of the amplifier section 2, after being attenuated in an attenuator 8, is applied to an input of a difference element 15 and the input signal of amplifier section 2 is applied to another input of difference element 15.

The output signal of difference element 15 is added to the signal from the source 10 in a summator 19 and is subsequently applied to the amplifier section 3 etc.

The output voltage of amplifier 1 equals the voltage across the resistor 4 and the voltage across output circuit 11. This voltage, which is attenuated in attentuator 7 and applied to an input of difference element 14, functions as a negative feedback voltage. This because of the fact that via the elements 7, 14, 18, 2 and 5 this voltage influences the voltage at the common point between the resistors 4, 5, 6 and the output circuit 11 and hence influences the voltage at the output of amplifier section 1. The same reasoning is of course valid for the voltages derived at the outputs of amplifiers 2 and 3.

Surprisingly it has been found, in spite of a closed loop via 1 - 7 - 14 - 18 - 2 - 8 - 15 - 19 - 3 - 9 - 16 - 17 - 1, that the stability of the arrangement described in the foregoing can be attained within wide margins, which is to be attributed to the action of the difference elements 14, 15 and 16. In particular, if an odd number of amplifier sections is used large deviations from the specified settings are permissible, but also if an even number of amplifier sections is used the principal requirement is merely that the signal components in the outputs of the difference elements 14, 15 and 16 should be sufficiently small, namely smaller than the actual input signal.

Figure 2:
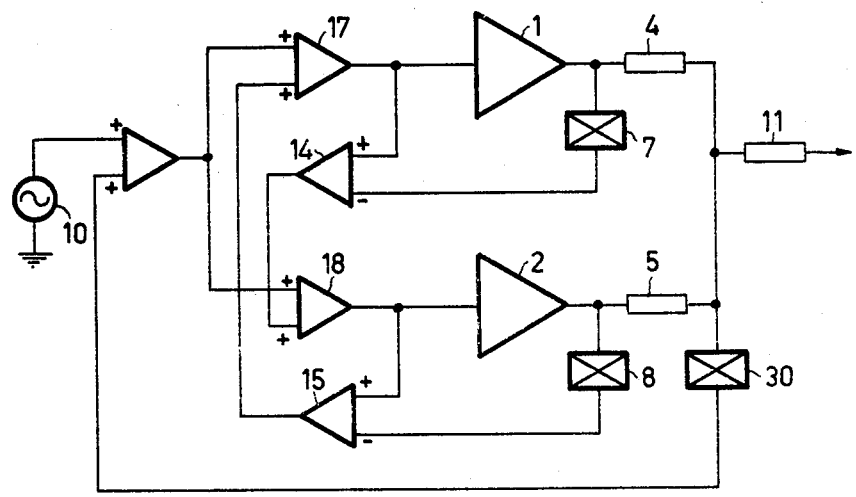
FIG. 2 represents a second embodiment.

The arrangement described with reference to FIG. 1 has the drawback that a part of the desired output power is lost in the resistors 4, 5 and 6. However, this drawback becomes less important as a greater number of amplifier sections are used. Another drawback of these resistors in combination with the control via the difference elements 14, 15 and 16 is that the internal resistance of the amplifier arrangement, viewed from the output circuit 11, is substantially increased. This drawback can be mitigated simply as illustrated in FIG. 2 by applying an overall negative feedback 30 between the common output circuit 11 and the input. FIG. 2 shows an arrangement of the type of FIG. 1 comprising only two amplifier sections, the reference numerals corresponding to those used in FIG. 1.

In a practical embodiment with 6 amplifier sections of the type TDA 1502 operating with an output circuit 11 of 8 Ohms, a value of 4 Ohms was selected for the resistors 4, 5 and 6. The total distortion at an output power of 50 W was reduced by a factor 8 to 10 in the bass and intermediate tone range and by a factor 3 in the extreme treble range (10 kHz).

What is claimed:

1. An amplifier arrangement, comprising: a signal input coupled to inputs of n amplifier sections which sections include outputs connected single-ended to a common output circuit through which the output signal currents of the amplifier sections are passed in the same phase; a resistor connected between the output of each amplifier section and the common output circuit; each amplifier section also including a difference element having a first input, a second input, and an output for supplying a corresponding compensation signal, the first input of the difference element being coupled to the input of the corresponding amplifier section; characterized in that each amplifier section also includes a negative feedback voltage which depends on the voltage across the output circuit and across the corresponding resistor, and an attenuator coupled to the corresponding amplifier output and also coupled to the second input of the corresponding difference element so that the feedback voltage of the $k^{th}$-amplifier section is applied to the second input of the corresponding difference element, and that the corresponding compensation signal of the $k^{th}$-amplifier section is applied to the input of the $(k+1)^{th}$-amplifier section (k ranging from 1 to n, and n being at least 2) through a summator coupled to both the input of the $(k+1)^{th}$-amplifier section and the signal input of the arrangement, whereby the arrangement has a low distortion and a high output power during operation.

2. An amplifier arrangement as claimed in claim 1, wherein each amplifier section has a low internal output impedance, characterized in that the arrangement also comprises means for applying a negative voltage feedback between the common output circuit and the input of the amplifier arrangement.

* * * * *